United States Patent [19]

Champagne

[11] 4,046,443

[45] Sept. 6, 1977

[54] PRINTED CIRCUIT CARD GUIDE

[75] Inventor: Patrick Joseph Champagne, Edina, Minn.

[73] Assignee: Control Data Corporation, Minneapolis, Minn.

[21] Appl. No.: 690,698

[22] Filed: May 27, 1976

[51] Int. Cl.² .......................... H01R 13/20; H05K 1/04
[52] U.S. Cl. .............................. 339/66 M; 339/17 LC; 339/176 MP; 339/186 M
[58] Field of Search ............... 339/17 LC, 65, 66 R, 339/176 MP, 66 M, 184 R, 184 M, 186 R, 186 M

[56] References Cited

U.S. PATENT DOCUMENTS

| 3,193,791 | 7/1965 | Bock | 339/65 |
| 3,197,731 | 7/1965 | Beale | 339/176 MP |
| 3,264,599 | 8/1966 | Kinkaid | 339/184 M |
| 3,675,299 | 7/1972 | Sherrill | 339/176 MP |
| 3,693,135 | 9/1972 | Vavrick | 339/176 MP |
| 3,775,643 | 11/1973 | Schachnow | 339/65 |
| 3,822,416 | 7/1974 | Haag | 339/65 |

Primary Examiner—Roy Lake
Assistant Examiner—Mark S. Bicks
Attorney, Agent, or Firm—Edward L. Schwarz

[57] ABSTRACT

A printed circuit card guide having a surface adapted to closely mate with a corresponding surface on the printed circuit card and restrict the card to a precise path during a portion of its travel prior to reaching its mating position. This assures that the pins and sockets correctly engage.

10 Claims, 5 Drawing Figures

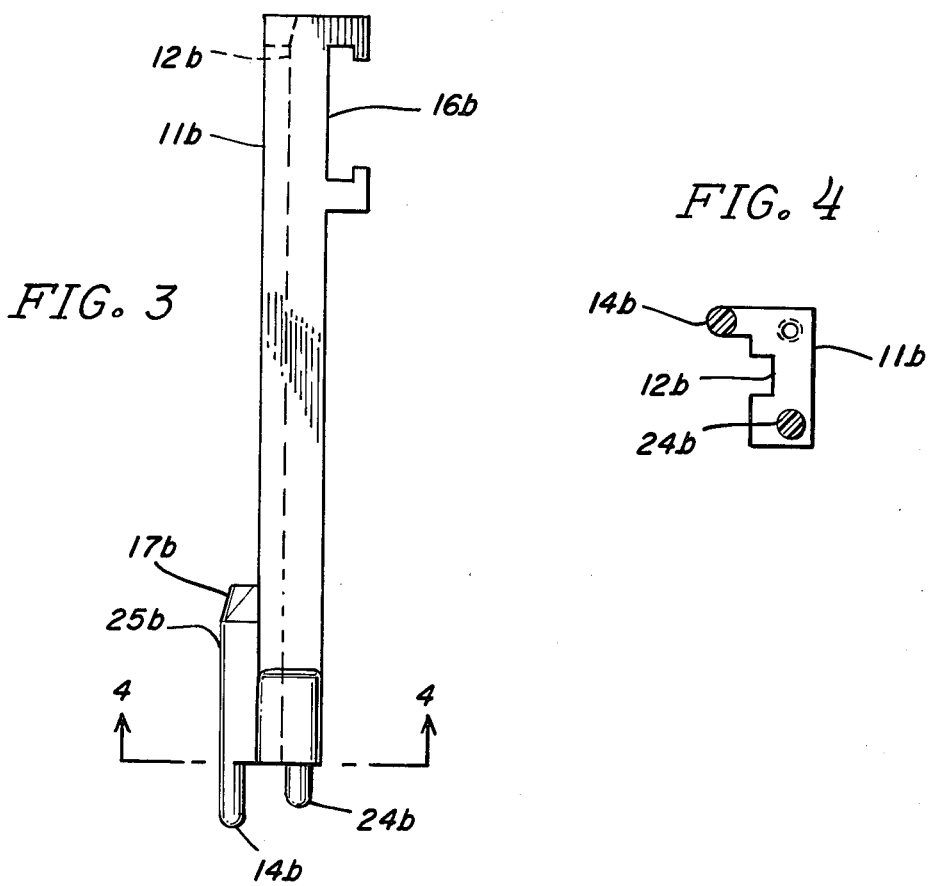
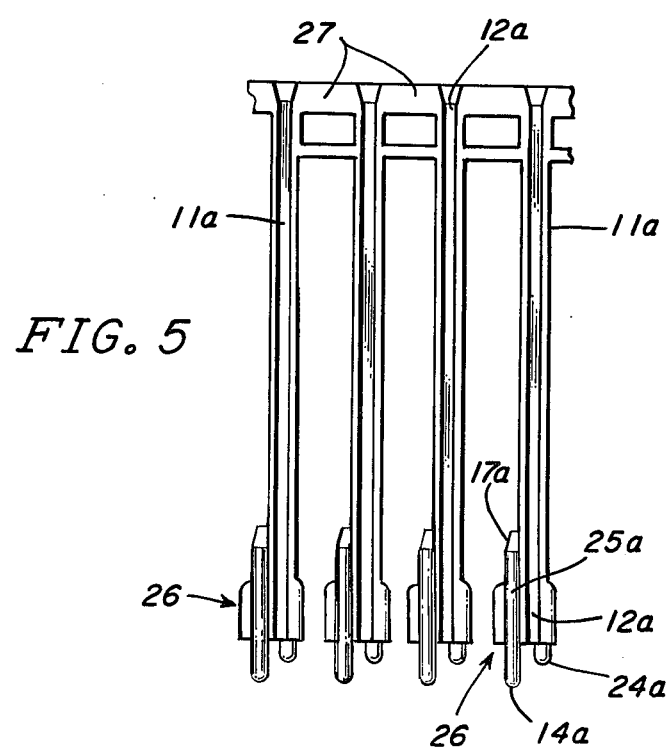

PRINTED CIRCUIT CARD GUIDE

BACKGROUND OF THE INVENTION

1. Field of the Invention

This invention relates to certain improvements in the card racks used to support printed circuit cards while said cards are inserted in mating connector blocks.

2. Description of the Prior Art

The closest art of which inventor is aware is contained in U.S. Pat. Nos. Re. 25,595; 3,311,863; and 3,197,731. These patents all disclose card rack apparatus employing card guides having slots into which opposite edges of the card to be held fit and slide to a mating position in which electrical contact is made between the circuitry on the card and the connector block. There are other references cited in connection with the prosecution of U.S. Pat. No. Re. 25,595, notably U.S. Pat. Nos. 3,008,113; 2,951,185 and 2,731,609 which also disclose card type circuit modules mounted in slotted retainers facilitating insertion and removal of individual cards.

Because of decreases in cost and size of individual logic elements, the trend is to place larger numbers of individual elements on each printed circuit card than has been previously practiced. This results in the necessity for a larger number of more closely spaced connections between the card and the connector block associated with it. Because of the larger number of interconnections between each block and its card, individual contacts have of necessity become smaller, more numerous, and more closely spaced. This in turn has required increased precision in aligning the card with the connector block when inserting the card into mated position. Because of the increased force necessary to mate the larger number of contacts on an individual card, it is not always possible when inserting the card to sense whether or not it is accurately positioned just prior to the individual contacts entering their respective sockets. Improper card positioning in this case results in bent and damaged pins, if pin contacts are used, and improper electrical connections. Therefore, it is desirable to position the card just prior to entry of the pins contacts to their respective sockets more accurately than has been heretofore conveniently possible.

BRIEF DESCRIPTION OF THE INVENTION

As conventionally configured, the apparatus comprises first and second card guides each having a slot therein adapted to receive one side edge of a printed circuit card. At a first end of each guide, where the card is initially inserted, a frame supports the two guides to maintain the appropriate spacing between them. The guides are oriented so that the slots face each other and allow the card to slide in them. The opposite or second end of each guide is attached to the connector block at a precise location. Adjacent the second end of each guide and also adjacent the slot is a special guide surface adapted to mate with a corresponding mating surface at each card edge adjacent the connector end of the card. Each pair of surfaces engages before the contacts on the card begin to engage their corresponding connector block contacts, as the card is inserted in the card rack. The location of the second end of each guide and the guide surface's position thereon are selected to constrain the motion of the connector end of the card along a precise predetermined path causing the contacts to correctly engage. A ramp portion of either each guide's guide surface or the card's mating surfaces smoothly translates the relatively loose fit of the card in the first portion of travel to its mating position, into the relatively close fit of the guide surfaces with their respective mating surfaces. This prevents the card from "catching" in the guides. Each ramp surface gently forms a transition from the loose to the close fitting surfaces. The second end of each guide must be precisely positioned with respect to the contacts on the connector block once the apparatus is assembled. This is preferably accomplished by providing a surface at the second end of each card guide shaped to interlock with a corresponding surface on the connector block. A pin and hole are preferred. This assures that the guide surface(s) are precisely positioned with respect to the contacts (sockets, pins, clips, etc.) on the connector block after assembly.

Accordingly, one purpose of this invention is to insure correct electrical connection between printed circuit cards and their connector blocks.

A second purpose is to prevent damage to projecting contact pins during such insertion.

Another purpose is to reduce friction between guides and cards during insertion and removal.

Still another purpose is to reduce the number and area of surfaces requiring precise tolerances to a minimum and thereby effect cost savings.

BRIEF DESCRIPTION OF THE DRAWINGS

FIG. 3 is a side view of a card guide incorporating the features of a preferred embodiment of the invention.

FIG. 4 is a bottom view of the card guide of FIG. 3.

FIG. 5 is a plan view of the invention embodied in a ganged guide.

DESCRIPTION OF THE PREFERRED EMBODIMENTS

Figures 1, 2:
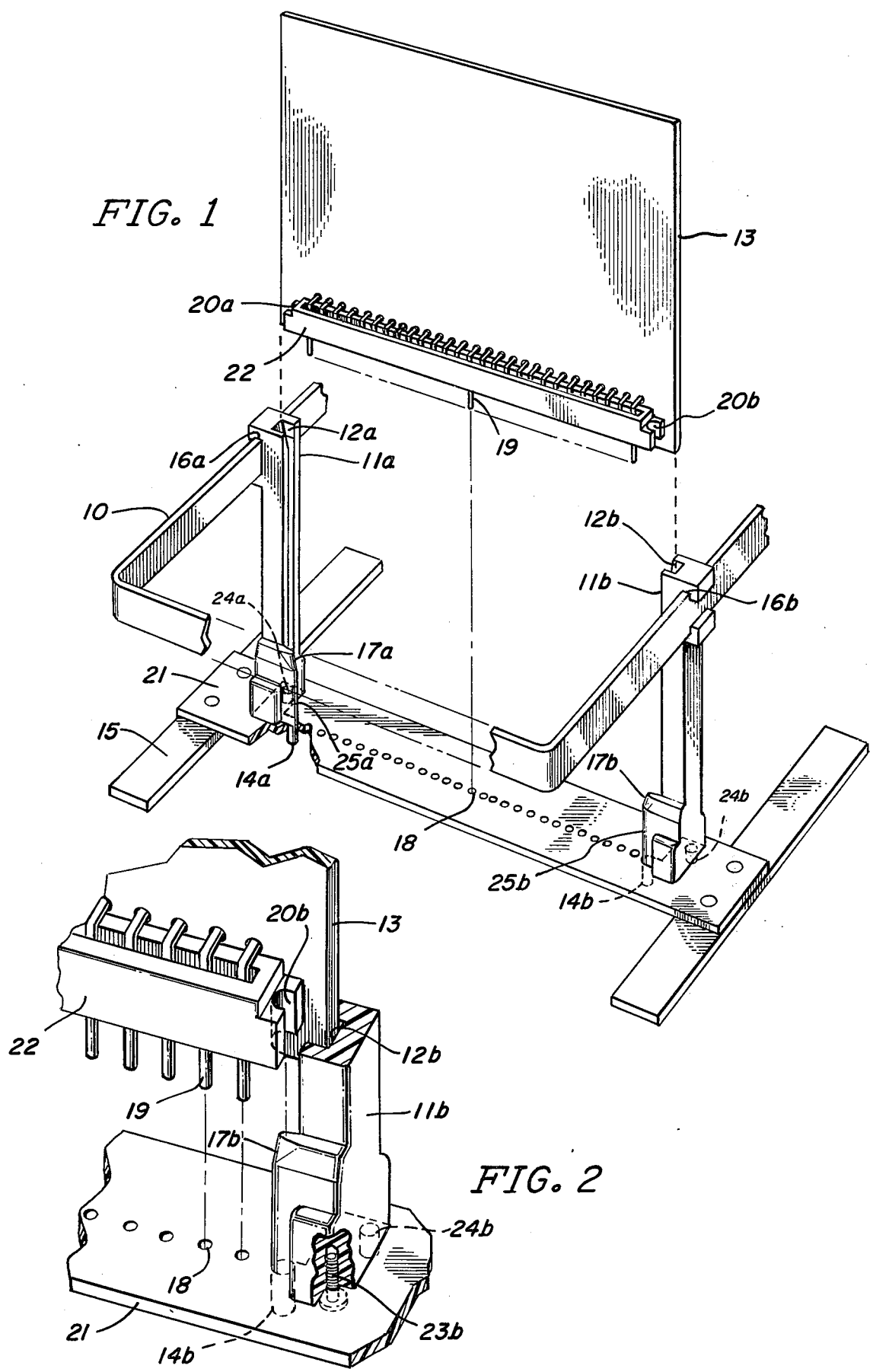
FIG. 1 is a sketch displaying apparatus incorporating the elements of this invention.
FIG. 2 is an enlargement displaying the features of the invention in a preferred embodiment.

In describing this invention, it will be convenient to refer back and forth between FIGS. 1 and 2 in which similar elements have similar reference numerals. Connector block 21 is supported at each end by base 15. Within connector block 21 are a series of sockets 18 adapted to receive contact pins 19. Block 21 can as easily carry pins 19, with sockets 18 on second connector block 22. Card guides 11a and 11b are attached to connector block 21 adjacent their second ends in a precise predetermined position with respect to sockets 18 and extend at right angles with respect to connector block 21. Precise positioning of the second ends of guides 11a and 11b is preferably accomplished by the use of projecting pins 14a and 14b which fit into precisely positioned holes in connector block 21. Pins 24a and 24b prevent twisting of the second ends during assembly when screws 23a (not shown) and 23b are tightened. The first, or upper ends as shown in FIG. 1, of guides 11a and 11b are positioned with respect to each other by frame 10. Slots 12a and 12b face each other in a parallel arrangement and are spaced apart a distance allowing the side edges of card 13 to easily enter and be retained within slots 12a and 12b while sliding downwardly toward connector block 21. Individual contact pins are carried by a second connector block 22. A common practice is for connector block 21 to have several rows of sockets 18 and mount pairs of guides 11a and 11b to allow a single connector block 21 to carry a plurality of cards 13. In such a case, base 15 may well be integral with connector block 21. Screw 23b fixes the connector end of guide 11b to connector block 21 and similar screws fix other guides similarly. So fastened, no other attachments between frame 10 and connector blocks 21 are necessary.

The inventive aspects of this apparatus are incorporated in the means which constrain second connector block 22 and pins 19 carried thereon to a precise path during the final approach of card 13 to its mated position. Guides 11a and 11b have on their connector end, adjacent connector block 21 when assembled, cylindrically convex guide surfaces 25a and 25b designed to closely engage and mate with concave mating surfaces 20a and 20b on second connector block 22. Clearances between engaging pairs of surfaces should be chosen to prevent movement of connector 22 perpendicular to movement of the card as it slides into position, along a precise predetermined path allowing pins 19 to accurately mate with sockets 18. Guide surfaces 25a and 25b must at least partially engage mating surfaces 20a and 20b before pins 19 enter sockets 18. Ramp surfaces 17a and 17b are faired into guide surfaces 25a and 25b and slope toward the guide body to form a smooth transition into the close engagement with surfaces 20a and 20b. As card 13 slides into mated position, mating surfaces 20a and 20b are guided smoothly into registration with guide surfaces 25a and 25b by these ramps.

The major advantage of this invention is that, while providing for accurate card insertion, at the same time a minimum number of surfaces need be precisely dimensioned and/or positioned to achieve this result. The dimensions of slots 12a and 12b are not critical. Similarly, the dimension and location of frame 10 and the position of attachment of guides 11a and 11b thereto are not critical. Second connector block 22 need not be precisely located on card 13. Size of card 13 is not critical. The surfaces which require accuracy are first of all, the holes in connector block 21 into which pins 14a and 14b are inserted, which must be accurately dimensioned and positioned with respect to sockets 18. Guide surfaces 25a and 25b must be accurately positioned with respect to pins 14a and 14b respectively. Pins 14a and 14b must accurately fit their mating holes. And finally, mating surfaces 20a and 20b must be accurately positioned with respect to pins 19. Note that the position of pin 24b (and similar pin 24a) and its hole is not as critical. Neither is the placement of the holes for retaining screw 23b and the shape of ramp 17b.

FIGS. 3 and 4 show the details of surface 25b and pin 14b. This design allows injection molding to accurately align these two surfaces by combining them into a single cylindrical surface where guide surface 25b is continuous with pin 14b.

This approach lends itself well to a ganged guide embodiment shown in FIG. 5. The first end 27 of each guide is unitary with the first end(s) of the adjacent guide(s) 11a. Second end 26 however is unconnected to any other second guide end. Thus, during assembly each second end 26 is positioned with respect to its individual connector block's contacts only. Adjustment by slight bending of individual guides 11a the amount necessary to interlock and position their second ends 26 properly compensates for imprecision in the spacing of adjacent connector blocks 21. No close tolerance between ganged guides is necessary at either end, nor is close tolerance between connector blocks 21 required.

Many variations on this embodiment are possible. Pairs of surfaces 20a and 25a, 20b and 25b can have a wide variety of shapes. The locations of the guide and mating surfaces with respect to slots 12a and 12b and connector block 21 can be arbitrarily chosen over a fairly wide range. The important factors are that they smoothly engage and restrict pins 19 to a precise predetermined path prior to pins 19 entering sockets 18. Either one or both of each pair of engaging surfaces may have a "ramp" type surface as long as the engaging surfaces engage smoothly without "catching" at the start of the transition from loose to close fit. If only one ramp surface per pair is used, it may be on either card connector 22 or guide 11b (11a). The engaging surfaces can be produced by a wide variety of means: injection molding, machining, casting, etc. as long as the necessary accuracy in their final position is obtained. And of course, pins 14a and 14b can be carried by connector block 21, and fit into mating holes on the second end of each guide.

What is claimed is:

1. An improved card rack/circuit card assembly allowing easy insertion and removal of individual circuit cards, comprising
  a. a frame including first and second parallel spaced-apart members;
  b. a circuit card having a connector end carrying a plurality of spaced-apart electrical contacts, and side edges intersecting the leading edge and spaced from each other a distance less than that separating the frame's parallel spaced-apart members;
  c. a connector block adapted to mate with the card's electrical contacts and form electrical connection with the contacts;
  d. first and second card guides each having first and second ends and a slot adapted to receive a card edge, and at least one guide having a guide surface adjacent the second end and facing the direction of the adjacent slot, said first and second card guides attached at their first ends respectively to the first and second parallel spaced-apart members and each attached to an end of the connector block at their second end in facing slot relationship in a precise preselected position and spaced to allow the card to enter both slots and slide connector end first into mating position with the connector block, said guide surface positioned to engage a portion of the card connector end prior to initial engagement of the contacts in the connector block and the circuit card connector end, and constrain the connector end of the card to a precise predetermined path during a portion of its travel preceding its arrival at its final mating position, said guide further including a ramp surface faired into the guide surface end nearer the first end of said guide, said ramp surface sloping generally away from the opposing guide and toward the first end of said guide.

2. The apparatus of claim 1 wherein the card connector end comprises a second connector block adapted to mate with the first, and having a mating surface positioned to engage the guide surface while the card slides toward its mated position.

3. The apparatus of claim 1, wherein the second end of each card guide and the first connector block respectively include areas interlocking with each other.

4. The apparatus of claim 1, wherein the second end of each card guide and the connector block end fastened thereto respectively include areas interlocking with each other.

5. The apparatus of claim 1, wherein a portion of the guide's guide surface is cylindrically convex with an axis substantially parallel to the slot axis.

6. The apparatus of claim 1, wherein a portion of the guide's ramp surface is convex.

7. The apparatus of claim 1, further comprising an interlocking surface on the second end of the guide adapted to snugly mate with a mating surface of the connector block, accurately positioning the second end on the connector block when so mated.

8. The apparatus of claim 7, wherein the interlocking surface comprises a pin projecting away from the card guide's first end.

9. The apparatus of claim 8, wherein the guide surface and the pin are parts of a continuous cylindrical surface.

10. The apparatus of claim 7, wherein the interlocking surface includes a hole on the second end of the guide facing away from the first end.

* * * * *